(12) United States Patent
Li

(10) Patent No.: US 10,261,374 B2
(45) Date of Patent: Apr. 16, 2019

(54) ARRAY SUBSTRATE AND METHOD OF REPAIRING BROKEN LINES THEREFOR

(71) Applicant: Shenzhen China Star Optoelectronics Technology Co., Ltd., Shenzhen (CN)

(72) Inventor: Shan Li, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 868 days.

(21) Appl. No.: 14/781,313

(22) PCT Filed: Apr. 1, 2015

(86) PCT No.: PCT/CN2015/075685
§ 371 (c)(1),
(2) Date: Sep. 30, 2015

(87) PCT Pub. No.: WO2016/127481
PCT Pub. Date: Aug. 18, 2016

(65) Prior Publication Data
US 2018/0348585 A1 Dec. 6, 2018

(30) Foreign Application Priority Data

Feb. 12, 2015 (CN) .......................... 2015 1 0074075

(51) Int. Cl.
G02F 1/1362 (2006.01)
H01L 51/52 (2006.01)
H01L 27/12 (2006.01)

(52) U.S. Cl.
CPC .. *G02F 1/136259* (2013.01); *G02F 1/136286* (2013.01); *H01L 27/124* (2013.01); *H01L 51/5237* (2013.01); *G02F 2001/136263* (2013.01)

(58) Field of Classification Search
CPC ......... G02F 1/136259; G02F 1/136286; H01L 27/124
See application file for complete search history.

(56) References Cited

FOREIGN PATENT DOCUMENTS

CN 201054062 Y 4/2008

*Primary Examiner* — Anthony Ho
(74) *Attorney, Agent, or Firm* — Leong C. Lei

(57) ABSTRACT

The present invention provides an array substrate and a method of repairing broken lines therefor. By providing a plurality of apertures on the array substrate correspondingly above the gate scan lines and the source-drain data lines, and the apertures are formed by deposing the passivation layer in the vias of the organic layer to directly form a metal long line by laser chemical vapor deposition between the apertures at two ends of a broken line position to recover a connection of the broken gate scan line or the source-drain data line as implementing broken line repair to the array substrate of the present invention. The method of repairing can omit the process of removing the organic layer by laser to save the time of repairing the broken lines and to effectively eliminate the machine laser waste as removing the organic layer.

18 Claims, 5 Drawing Sheets

ARRAY SUBSTRATE AND METHOD OF REPAIRING BROKEN LINES THEREFOR

FIELD OF THE INVENTION

The present invention relates to a display skill field, and more particularly to an array substrate and a method of repairing broken lines for the array substrate.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

Generally, the liquid crystal display panel comprises a CF (Color Filter) substrate, a TFT (Thin Film Transistor) substrate, LC (Liquid Crystal) sandwiched between the CF substrate and TFT substrate and sealant. The formation process generally comprises: a forepart Array process (thin film, photo, etching and stripping), a middle Cell process (Lamination of the TFT substrate and the CF substrate) and a post module assembly process (Attachment of the driving IC and the printed circuit board). The forepart Array process is mainly to form the TFT substrate for controlling the movement of the liquid crystal molecules; the middle Cell process is mainly to add liquid crystal between the TFT substrate and the CF substrate; the post module assembly process is mainly the driving IC attachment and the integration of the printed circuit board. Thus, the liquid crystal molecules are driven to rotate and display pictures.

With the constant development of the liquid crystal panel technology, more and more new technologies have been applied in the thin film transistor array substrate, such as In-Plane Switching (IPS), Fringe Field Switching (FFS), Color Filter On Array (COA) and et cetera. These technologies have higher demands for the flatness of the display substrate and generally, an organic layer, such as a color resist layer, a flat layer, which is thicker is required to be deposed on the array substrate. During the manufacture process of the array substrate, there may be broken line situations happening to the metal lines, including the scan lines and the data lines due to the effects of various reasons. For repairing such broken lines of the array substrate, the long line repair is executed after the broken line repairer removes the organic layer and the transparent electrode at the moment of the broken line repair. The broken line repair takes a lot of time. When the organic layer cannot be completely removed, it can affect the broken line repair success rate of the product.

SUMMARY OF THE INVENTION

An objective of the present invention is to provide an array substrate, and a plurality of apertures are formed on the surface of the array substrate where correspond to the gate scan lines and source-drain data lines, and the apertures are formed at the via of the organic layer for directly forming a metal long line by laser chemical vapor deposition between the apertures at two ends of a broken line position for repair to omit the process of removing the organic layer with laser to raise the repair efficiency and the repair success rate as implementing broken line repair to the array substrate of the present invention.

An objective of the present invention is further to provide a method of repairing broken lines for the array substrate, by deposing a metal long line with laser chemical vapor deposition between the apertures at two ends of a broken line position to recover a connection of the broken gate scan line or the source-drain data line to omit the process of removing the organic layer with laser to raise the repair efficiency and the repair success rate. Meanwhile, the machine laser loss as removing the organic layer can be effectively reduced. Thus, the display quality of the liquid crystal panel product is promoted.

For realizing the aforesaid objectives, the present invention provides an array substrate, comprising a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;

wherein, the gate scan lines and the source-drain data lines are perpendicularly and crosswise arranged on the substrate, and a first via is formed on the organic layer corresponding to an intersection of the gate scan line and the source-drain data line, and the second passivation layer is deposed in the first via to form a first aperture.

A dimension of the first aperture is 15 μm×15 μm.

The organic layer is a color resist layer or a flat layer; material of the first passivation layer and the second passivation layer is inorganic material; a thickness of the organic layer is larger than a thickness of the first passivation layer and a thickness of the second passivation layer.

A second aperture is further provided between two adjacent first apertures corresponding to the source-drain data lines on the array substrate, and the second passivation layer is deposed in a second via of the organic layer to form the second aperture.

A third aperture is further provided between two adjacent first apertures corresponding to the gate scan lines on the array substrate, and the second passivation layer is deposed in a third via of the organic layer to form the third aperture.

Both a dimension of the second aperture and a dimension of the third aperture are 7 μm×7 μm.

The present invention further provides an array substrate, comprising a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;

wherein, the gate scan lines and the source-drain data lines are perpendicularly and crosswise arranged on the substrate, and a first via is formed on the organic layer corresponding to an intersection of the gate scan line and the source-drain data line, and the second passivation layer is deposed in the first via to form a first aperture;

wherein a dimension of the first aperture is 15 μm×15 μm;

wherein the organic layer is a color resist layer or a flat layer; material of the first passivation layer and the second passivation layer is inorganic material; a thickness of the organic layer is larger than a thickness of the first passivation layer and a thickness of the second passivation layer.

The present invention further a method of repairing broken lines for an array substrate, and the array substrate comprises a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;

wherein, the gate scan lines and the source-drain data lines are perpendicularly and crosswise arranged on the substrate, and a first via is formed on the organic layer corresponding to each intersection of the gate scan lines and the source-drain data lines, and the second passivation layer is deposed in the first via to form a first aperture;

a metal long line is formed by laser chemical vapor deposition between the first apertures of the gate scan line or the source-drain data line at two ends of a broken line position to recover a connection of the broken gate scan line or the source-drain data line as the gate scan line or the source-drain data line on the array substrate is broken.

A second aperture is further provided between two adjacent first apertures corresponding to the source-drain data lines on the array substrate, and the second passivation layer is deposed in a second via of the organic layer to form the second aperture;

a metal long line is formed by laser chemical vapor deposition between the first aperture and the second aperture at two ends of a broken line position to recover a connection of the broken source-drain data line as the source-drain data line on the array substrate is broken, and a distance between the two adjacent first apertures of the source-drain data line is larger than a broken line repair ability of a machine.

A third aperture is further provided between two adjacent first apertures corresponding to the gate scan lines on the array substrate, and the second passivation layer is deposed in a third via of the organic layer to form the third aperture;

a metal long line is formed by laser chemical vapor deposition between the first aperture and the third aperture at two ends of a broken line position to recover a connection of the broken gate scan line as the gate scan line is broken, and a distance between the two adjacent first apertures of the gate scan line is larger than a broken line repair ability of a machine.

The metal long line is a straight line, and material of the metal long line is tungsten carbonyl.

The benefits of the present invention are: the present invention provides an array substrate and a method of repairing broken lines therefor. By providing a plurality of apertures on the array substrate correspondingly above the gate scan lines and the source-drain data lines, and the apertures are formed by deposing the passivation layer in the vias of the organic layer to directly form a metal long line by laser chemical vapor deposition between the apertures at two ends of a broken line position to recover a connection of the broken gate scan line or the source-drain data line as implementing broken line repair to the array substrate of the present invention. The method of repairing can omit the process of removing the organic layer by laser to save the time of repairing the broken lines and to effectively eliminate the machine laser waste as removing the organic layer. The broken line repair efficiency and the repair success rate are raise, and thus, the display quality of the liquid crystal panel production is promoted.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
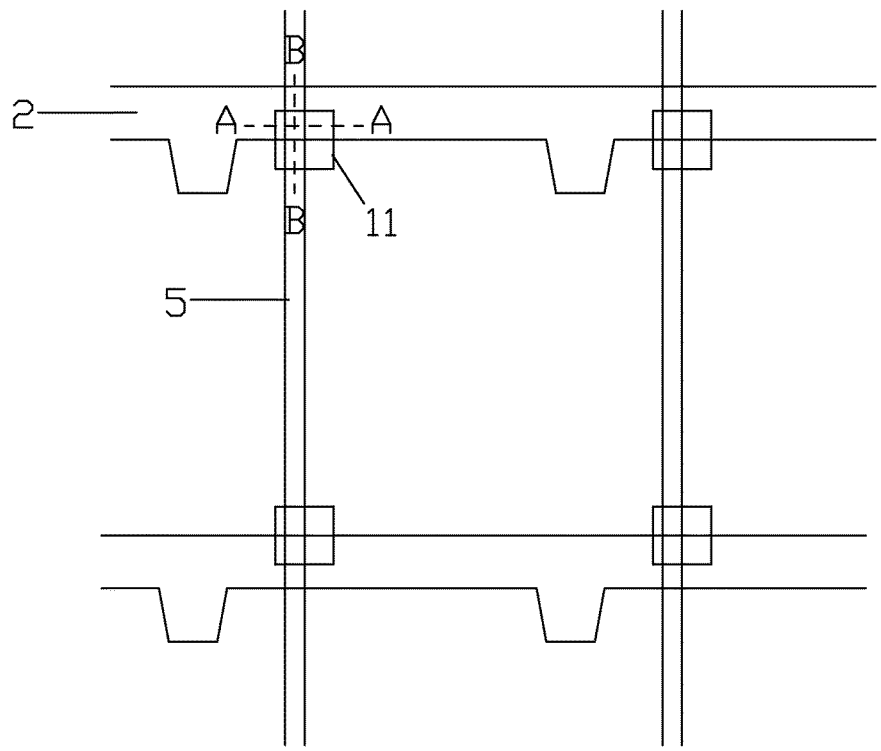
FIG. 1 is a structural diagram of an array substrate according to first embodiment of the present invention.
Figure 2:
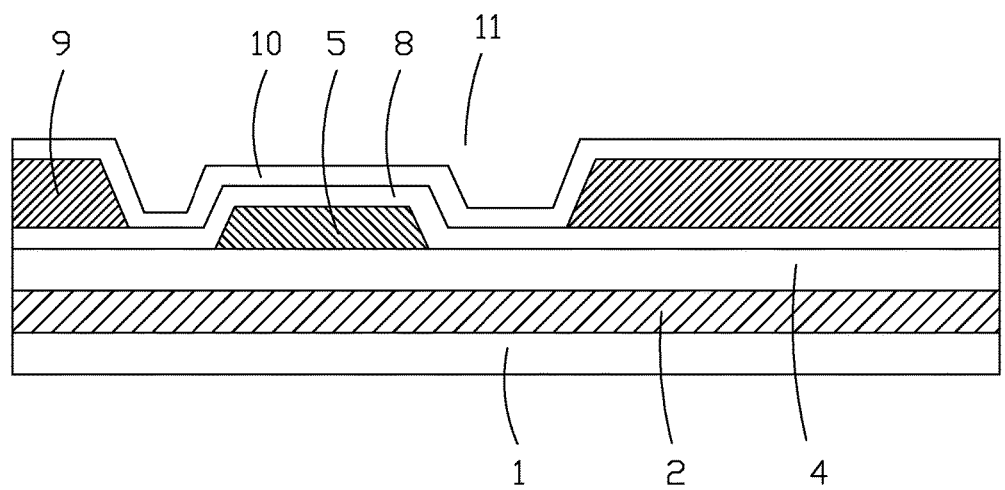
FIG. 2 is a sectional diagram along the A-A line at the first aperture of the array substrate shown in FIG. 1.
Figure 3:
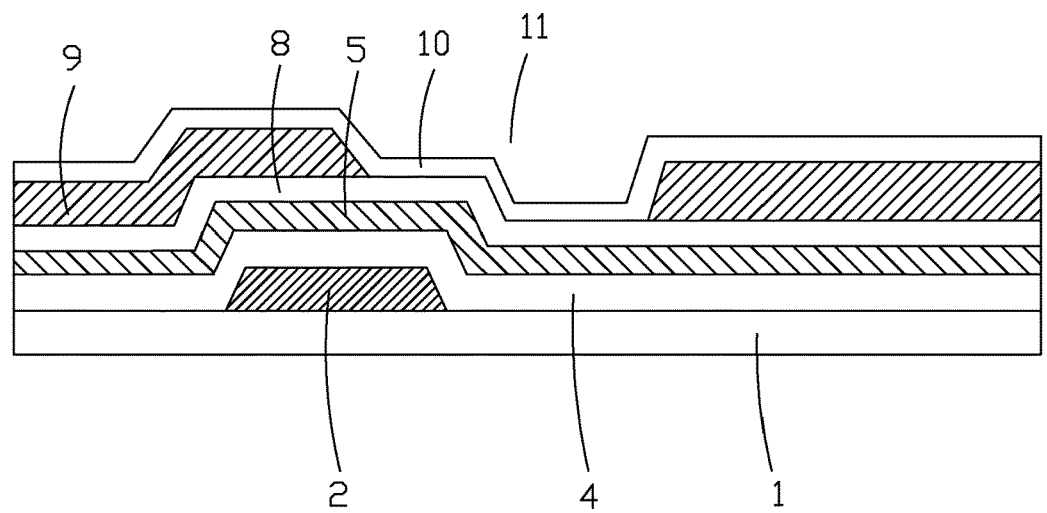
FIG. 3 is a sectional diagram along the B-B line at the first aperture of the array substrate shown in FIG. 1.

Please refer to FIG. 1-FIG. 3, which show the first embodiment of the array substrate according to the present invention. The array substrate comprises: a substrate 1, gate scan lines 2 on the substrate 1, a gate isolation layer 4 on the gate scan lines 2 and the substrate 1, source-drain data lines 5 on the gate isolation layer 4, a first passivation layer 8 on the source-drain data lines 5 and the gate isolation layer 4, an organic layer 9 on the first passivation layer 8 and a second passivation layer 10 on the organic layer 9 and the first passivation layer 8.

Specifically, the organic layer 9 is a color resist layer or a flat layer; material of the first passivation layer 8 and the second passivation layer 10 is inorganic material; a thickness of the organic layer 9 is larger than thicknesses of the first passivation layer 8 and the second passivation layer 10.

Specifically, the gate scan lines 2 and the source-drain data lines 5 are perpendicularly and crosswise arranged on the substrate 1, and a first via is formed on the organic layer 9 corresponding to each intersection of the gate scan lines 2 and the source-drain data lines 5, and the second passivation layer 10 is deposed in the via to form a first aperture 11, and as shown in FIG. 2 and FIG. 3, a structure of the array substrate at the first aperture 11 comprises the substrate 1, the gate scan line 2, the gate isolation layer 4, the source-drain data line 5, the first passivation layer 8 and the second passivation layer 10. In other words, no organic 9 is positioned on the substrate right at the first aperture 11.

Preferably, a dimension of the first aperture 11 is 15 μm×15 μm.

Figure 4:
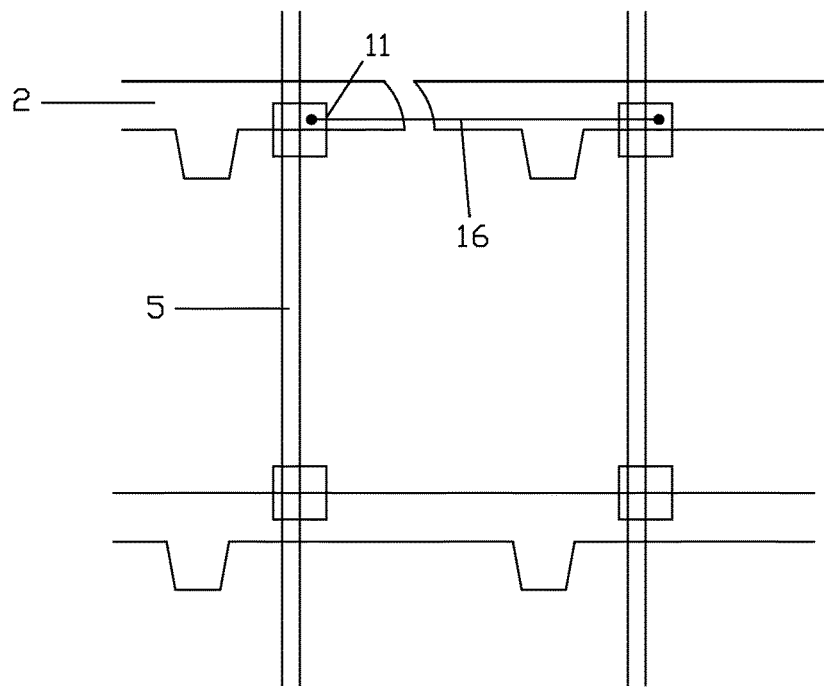
FIG. 4 is a diagram of repairing the broken gate scan line for the array substrate shown in FIG. 1 by utilizing the method of laser chemical vapor deposition metal long line.

As shown in FIG. 4, a metal long line 16 is formed by laser chemical vapor deposition between the first apertures 11 of the gate scan line 2 at two ends of a broken line position to recover a connection of the broken gate scan line 2 as the gate scan line 2 is broken due to the deficient process.

Figure 5:
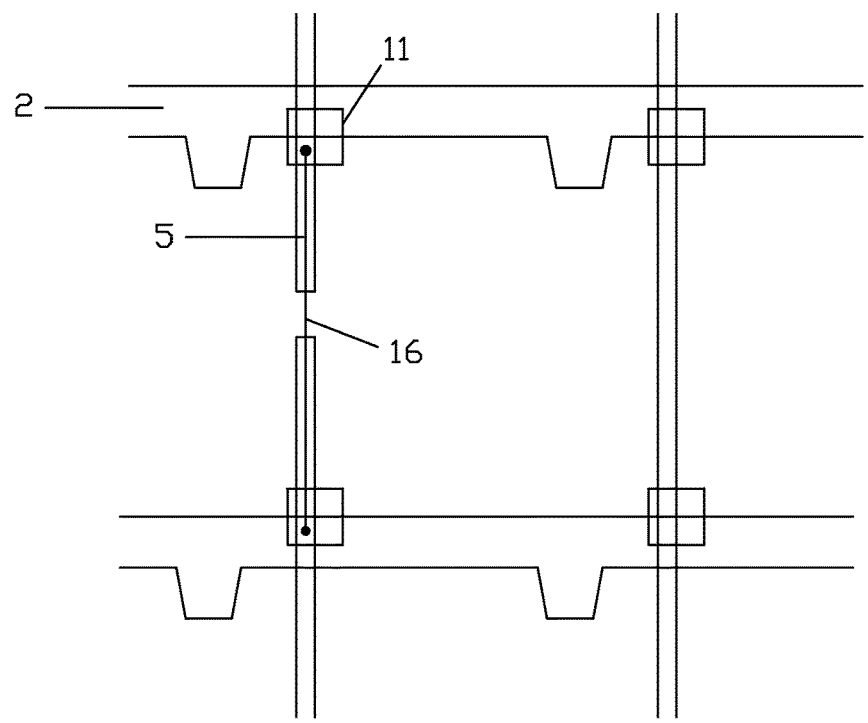
FIG. 5 is a diagram of repairing the broken source data line for the array substrate shown in FIG. 1 by utilizing the method of laser chemical vapor deposition metal long line.

As shown in FIG. 5, a metal long line 16 is formed by laser chemical vapor deposition between the first apertures 11 of the source-drain data line 5 at two ends of a broken line position to recover a connection of the broken source-drain data line 5 as the source-drain data line 5 is broken due to the deficient process.

Specifically, the metal long line 16 is a straight line, and material of the metal long line 16 is tungsten carbonyl.

In the aforesaid method of repairing broken lines for the array substrate, no organic 9 is positioned on the substrate right at the first aperture 11 above the gate scan line 2 and the source-drain data line 5. The process of removing the organic layer with laser is omitted and the time of repairing the broken lines is saved to raise the utilization rate to effectively raise the repair efficiency and the repair success rate, and thus, the display quality of the liquid crystal panel production is promoted.

Figure 6:
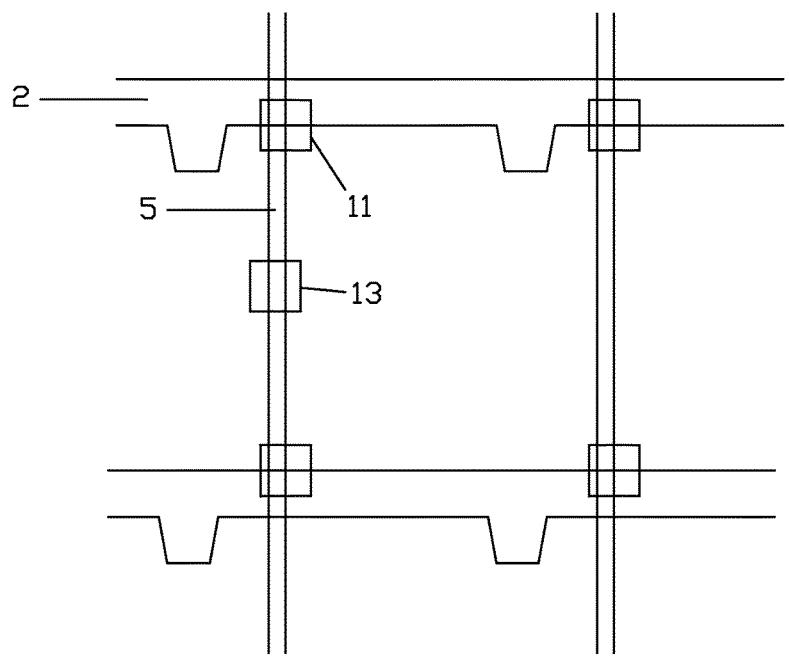
FIG. 6 is a structural diagram of an array substrate according to the second embodiment of the present invention.

Please refer to FIG. 6, which is an array substrate according to the second embodiment of the present invention. As comparing the second embodiment with the first embodiment, the difference is that, a second aperture 13 is provided between two adjacent first apertures 11 corresponding to the source-drain data lines 5 on the array substrate, and the second passivation layer 10 is deposed in a second via of the organic layer 9 to form the second aperture 13. The structure of the array substrate at the second aperture 13 comprises a substrate 1, the gate isolation layer 4, the source-drain data lines 5, the first passivation layer 8 and the second passivation layer 10.

Preferably, a dimension of the second aperture 13 is 7 μm×7 μm, and the second aperture 13 is in the middle position between two adjacent first apertures 11 of the source-drain data line 5.

Figure 7:
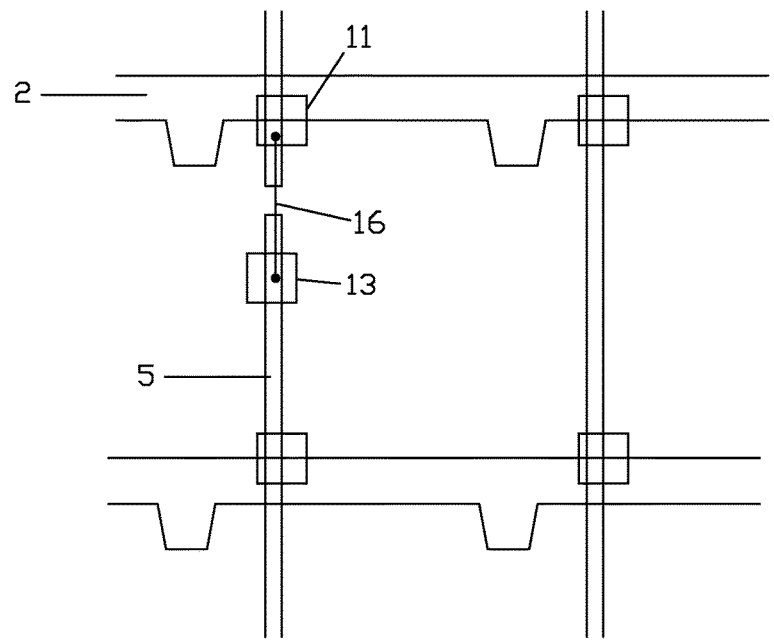
FIG. 7 is a diagram of repairing the broken source data line for the array substrate shown in FIG. 6 by utilizing the method of laser chemical vapor deposition metal long line.
Figure 8:
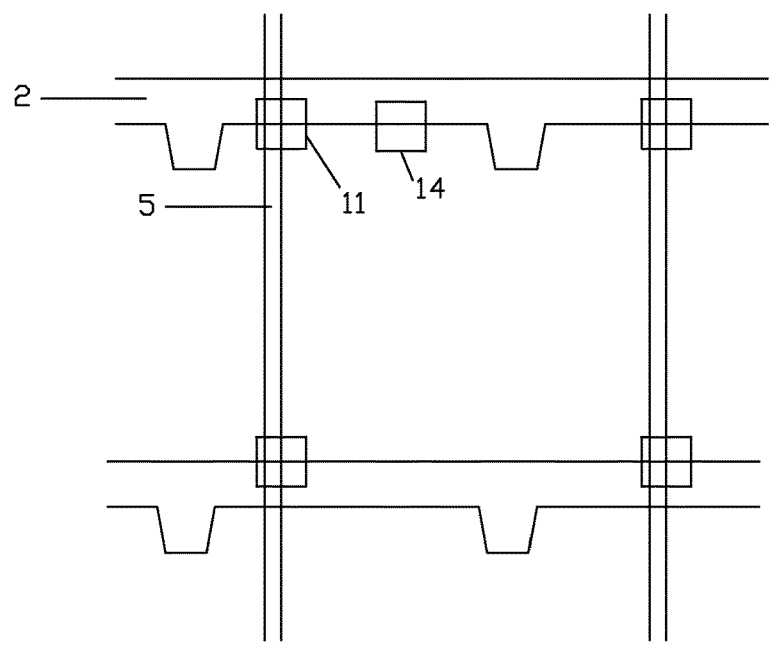
FIG. 8 is a structural diagram of an array substrate according to the third embodiment of the present invention.

As shown in FIG. 7, a metal long line 16 is formed by laser chemical vapor deposition between the first aperture 11 and the second aperture 13 at two ends of a broken line position to recover a connection of the broken source-drain data line 5 as the source-drain data line 5 is broken, and a distance between the two adjacent first apertures 11 of the source-drain data line 5 is larger than a broken line repair ability of a machine; in comparison with the method of repairing broken lines shown in FIG. 8, the method of repairing shortens the path of the metal long line deposed by the laser chemical vapor deposition, and the time of repairing the broken lines is saved to raise the utilization rate of the machine.

Please refer to FIG. 8, which is an array substrate according to the third embodiment of the present invention. As comparing the third embodiment with the first embodiment, the difference is that, a third aperture 14 is provided between two adjacent first apertures 11 corresponding to the gate scan lines 5 on the array substrate, and the second passivation layer 10 is deposed in a third via of the organic layer 9 to form the third aperture 14. The structure of the array substrate at the third aperture 14 comprises a substrate 1, the gate scan line 2, the gate isolation 4, the first passivation layer 8 and the second passivation layer 10.

Preferably, a dimension of the third aperture 14 is 7 μm×7 μm, and the third aperture 14 is in the middle position between two adjacent first apertures 11 of the gate scan line 2.

Figure 9:
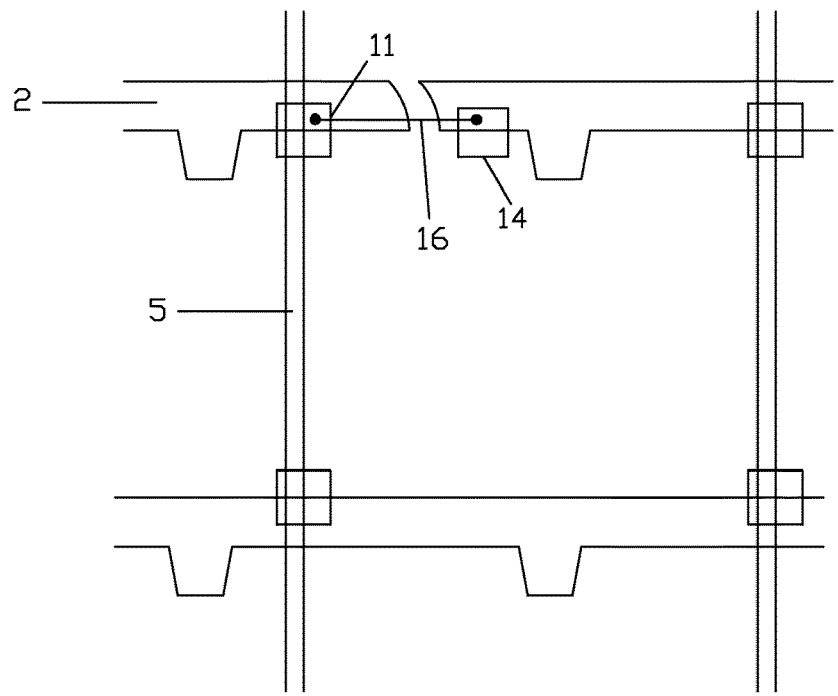
FIG. 9 is a diagram of repairing the broken gate scan line for the array substrate shown in FIG. 8 by utilizing the method of laser chemical vapor deposition metal long line.

As shown in FIG. 9, a metal long line 16 is formed by laser chemical vapor deposition between the first aperture 11 and the third aperture 14 at two ends of a broken line position to recover a connection of the broken gate scan line 2 as the gate scan line 2 is broken, and a distance between the two adjacent first apertures 11 of the gate scan line 2 is larger than a broken line repair ability of a machine; in comparison with the method of repairing broken lines shown in FIG. 7, the method of repairing shortens the path of the metal long line deposed by the laser chemical vapor deposition, and the time of repairing the broken lines is saved to raise the utilization rate of the machine.

Figure 10:
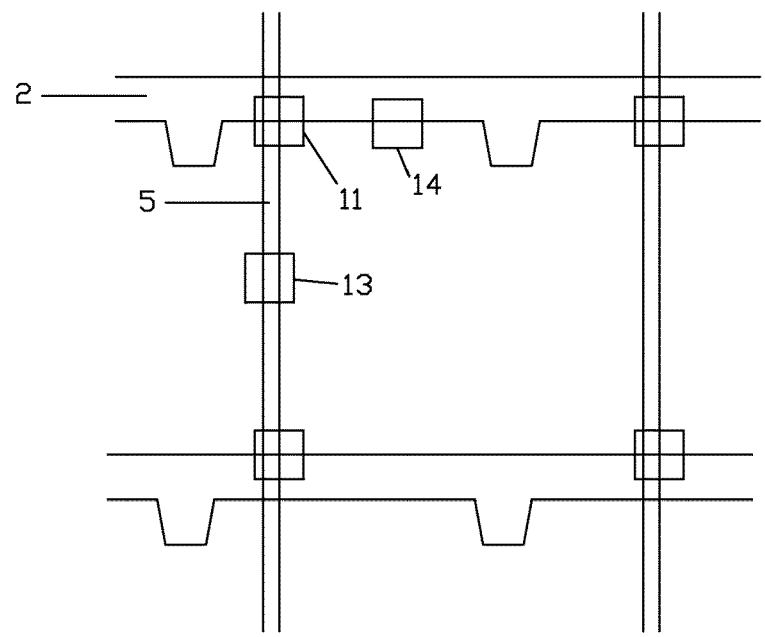
FIG. 10 is a structural diagram of an array substrate according to the fourth embodiment of the present invention.

Please refer to FIG. 10, which is an array substrate according to the fourth embodiment of the present invention. As comparing the fourth embodiment with the first embodiment, the difference is that, a second aperture 13 is provided between two adjacent first apertures 11 corresponding to the source-drain data lines 5 on the array substrate, and the second passivation layer 10 is deposed in a second via of the organic layer 9 to form the second aperture 13. The structure of the array substrate at the second aperture 13 comprises a substrate 1, the gate isolation layer 4, the source-drain data lines 5, the first passivation layer 8 and the second passivation layer 10; a third aperture 14 is provided between two adjacent first apertures 11 corresponding to the gate scan lines 5 on the array substrate, and the second passivation layer 10 is deposed in a third via of the organic layer 9 to form the third aperture 14. The structure of the array substrate at the third aperture 14 comprises a substrate 1, the gate scan line 2, the gate isolation 4, the first passivation layer 8 and the second passivation layer 10.

Preferably, a dimension of the second aperture 13 is 7 μm×7 μm, the second aperture 13 is in the middle position between two adjacent first apertures 11 of the source-drain data line 5; a dimension of the third aperture 14 is 7 μm×7 μm, the third aperture 14 is in the middle position between two adjacent first apertures 11 of the gate scan line 2.

A metal long line 16 is formed by laser chemical vapor deposition between the first aperture 11 and the second aperture 13 at two ends of a broken line position to recover a connection of the broken source-drain data line 5 as the source-drain data line 5 is broken, and a distance between the two adjacent first apertures 11 of the source-drain data line 5 is larger than a broken line repair ability of a machine;

a metal long line 16 is formed by laser chemical vapor deposition between the first aperture 11 and the third aperture 14 at two ends of a broken line position to recover a connection of the broken gate scan line 2 as the gate scan line 2 is broken, and a distance between the two adjacent first apertures 11 of the gate scan line 2 is larger than a broken line repair ability of a machine.

In conclusion, the present invention provides an array substrate and a method of repairing broken lines therefor. By providing a plurality of apertures on the array substrate correspondingly above the gate scan lines and the source-drain data lines, and the apertures are formed by deposing the passivation layer in the vias of the organic layer to directly form a metal long line by laser chemical vapor deposition between the apertures at two ends of a broken line position to recover a connection of the broken gate scan line or the source-drain data line as implementing broken line repair to the array substrate of the present invention. The method of repairing can omit the process of removing the organic layer by laser to save the time of repairing the broken lines and to effectively eliminate the machine laser waste as removing the organic layer. The broken line repair efficiency and the repair success rate are raise, and thus, the display quality of the liquid crystal panel production is promoted.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;
   wherein, the gate scan lines and the source-drain data lines are perpendicularly and crosswise arranged on the substrate, and a first via is formed on the organic layer corresponding to an intersection of the gate scan line and the source-drain data line, and the second passivation layer is deposed in the first via to form a first aperture.

2. The array substrate according to claim 1, wherein a dimension of the first aperture is 15 μm×15 μm.

3. The array substrate according to claim 1, wherein the organic layer is a color resist layer or a flat layer; material of the first passivation layer and the second passivation layer is inorganic material; a thickness of the organic layer is larger than a thickness of the first passivation layer and a thickness of the second passivation layer.

4. The array substrate according to claim 1, wherein a second aperture is further provided between two adjacent first apertures corresponding to the source-drain data lines on the array substrate, and the second passivation layer is deposed in a second via of the organic layer to form the second aperture.

5. The array substrate according to claim 4, wherein a dimension of the second aperture is 7 μm×7 μm.

6. The array substrate according to claim 1, wherein a third aperture is further provided between two adjacent first apertures corresponding to the gate scan lines on the array substrate, and the second passivation layer is deposed in a third via of the organic layer to form the third aperture.

7. The array substrate according to claim 6, wherein a dimension of the third aperture is 7 μm×7 μm.

8. An array substrate, comprising a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;
   wherein, the gate scan lines and the source-drain data lines are perpendicularly and crosswise arranged on the substrate, and a first via is formed on the organic layer corresponding to an intersection of the gate scan line and the source-drain data line, and the second passivation layer is deposed in the first via to form a first aperture;
   wherein a dimension of the first aperture is 15 μm×15 μm;
   wherein the organic layer is a color resist layer or a flat layer; material of the first passivation layer and the second passivation layer is inorganic material; a thickness of the organic layer is larger than a thickness of the first passivation layer and a thickness of the second passivation layer.

9. The array substrate according to claim 8, wherein a second aperture is further provided between two adjacent first apertures corresponding to the source-drain data lines on the array substrate, and the second passivation layer is deposed in a second via of the organic layer to form the second aperture.

10. The array substrate according to claim 9, wherein a dimension of the second aperture is 7 μm×7 μm.

11. The array substrate according to claim 8, wherein a third aperture is further provided between two adjacent first apertures corresponding to the gate scan lines on the array substrate, and the second passivation layer is deposed in a third via of the organic layer to form the third aperture.

12. The array substrate according to claim 11, wherein a dimension of the third aperture is 7 μm×7 μm.

13. A method of repairing broken lines for an array substrate, and the array substrate comprises a substrate, gate scan lines on the substrate, a gate isolation layer on the gate scan lines and the substrate, source-drain data lines on the gate isolation layer, a first passivation layer on the source-drain data lines and the gate isolation layer, an organic layer on the first passivation layer and a second passivation layer on the organic layer and the first passivation layer;
   wherein, the gate scan lines and the source-drain data lines are perpendicularly and crosswise arranged on the substrate, and a first via is formed on the organic layer corresponding to each intersection of the gate scan lines and the source-drain data lines, and the second passivation layer is deposed in the first via to form a first aperture;
   a metal long line is formed by laser chemical vapor deposition between the first apertures of the gate scan line or the source-drain data line at two ends of a broken line position to recover a connection of the broken gate scan line or the source-drain data line as the gate scan line or the source-drain data line on the array substrate is broken.

14. The method of repairing broken lines for the array substrate according to claim 13, wherein the metal long line is a straight line, and material of the metal long line is tungsten carbonyl.

15. The method of repairing broken lines for the array substrate according to claim 13, wherein a second aperture is further provided between two adjacent first apertures corresponding to the source-drain data lines on the array substrate, and the second passivation layer is deposed in a second via of the organic layer to form the second aperture;
   a metal long line is formed by laser chemical vapor deposition between the first aperture and the second aperture at two ends of a broken line position to recover a connection of the broken source-drain data line as the source-drain data line on the array substrate is broken, and a distance between the two adjacent first apertures of the source-drain data line is larger than a broken line repair ability of a machine.

16. The method of repairing broken lines for the array substrate according to claim 15, wherein the metal long line is a straight line, and material of the metal long line is tungsten carbonyl.

17. The method of repairing broken lines for the array substrate according to claim 13, wherein a third aperture is further provided between two adjacent first apertures corresponding to the gate scan lines on the array substrate, and the second passivation layer is deposed in a third via of the organic layer to form the third aperture;
 a metal long line is formed by laser chemical vapor deposition between the first aperture and the third aperture at two ends of a broken line position to recover a connection of the broken gate scan line as the gate scan line is broken, and a distance between the two adjacent first apertures of the gate scan line is larger than a broken line repair ability of a machine.

18. The method of repairing broken lines for the array substrate according to claim 17, wherein the metal long line is a straight line, and material of the metal long line is tungsten carbonyl.

\* \* \* \* \*